United States Patent [19]

Yahalom

[11] Patent Number: 5,057,388

[45] Date of Patent: Oct. 15, 1991

[54] METHOD FOR THE PREPARATION OF MASK FOR X-RAY LITHOGRAPHY

[75] Inventor: Joseph Yahalom, Haifa, Israel

[73] Assignee: Technion Research and Development Foundation Ltd., Haifa, Israel

[21] Appl. No.: 447,752

[22] Filed: Dec. 8, 1989

Related U.S. Application Data

[63] Continuation-in-part of Ser. No. 357,934, May 26, 1989, abandoned, and a continuation-in-part of Ser. No. 378,940, Jul. 12, 1989, abandoned, and a continuation-in-part of Ser. No. 442,868, Nov. 29, 1989, abandoned.

[51] Int. Cl.$^5$ .............................................. G03F 9/00
[52] U.S. Cl. ...................................... 430/5; 430/967; 378/35
[58] Field of Search ...................... 430/5, 967; 378/35

[56] References Cited

U.S. PATENT DOCUMENTS 4,634,643  1/1987  Suzuki ..................................... 430/5

FOREIGN PATENT DOCUMENTS 85170  7/1978  Japan ..................................... 430/5
14837  1/1983  Japan ..................................... 430/5

Primary Examiner—Charles L. Bowers, Jr.
Assistant Examiner—Thomas R. Neville
Attorney, Agent, or Firm—Browdy and Neimark

[57] ABSTRACT

A method of obtaining a mask for X-ray lithography having a thin oxide film supported on an annular silicon base includes the following steps:
(a) deposition of an oxide layer such as titania or zirconia, on a silicon or copper substrate;
(b) etching selectively a portion of the backside of the substrate, obtaining a membrane on the etched portion; and
(c) obtaining a pattern delineation through a photoresist on the membrane framed by the silicon or copper substrate.

The mask prepared according to the present invention does not suffer from any distortion and preserves its accuracy even under the stresses incurred during the mask preparation and use.

20 Claims, No Drawings

METHOD FOR THE PREPARATION OF MASK FOR X-RAY LITHOGRAPHY

CROSS-REFERENCE TO RELATED APPLICATIONS

This application is a continuation in part of application Ser. No. 07/357,934, filed May 26, 1989, now abandoned, of application Ser. No. 07/378,940, filed July 12, 1989, now abandoned, and of application Ser. No. 07/442,868, filed on Nov. 29, 1989, now allowed.

FIELD OF THE INVENTION

The present invention relates to X-ray lithography. More particularly, the invention relates to a new method for obtaining a mask for X-ray lithography.

BACKGROUND OF THE INVENTION

Lithography is recognized as one of the most widely used methods of printing. In its usual commercial or industrial application it is known as offset lithography because the inked image is first printed on a rubber cylinder, which then offsets or transfers the image to paper or other material. In lithography, the matter to be printed is neither raised above nor sunk below the surface of the plate but remains on the surface, or plane.

X-ray lithography, developed in the last twenty years, has become an important aid to the art of lithography. X-ray lithography is now considered to be an effective method for pattern replication down to the submicron range, required by the huge, development of the technology for the production of microelectronic circuits. In this technique, by a beam of X-rays of low angular divergence, a shadow image of the mask pattern is projected onto the wafer which is coated with an X-ray sensitive resist. Accordingly, high demands must be made on the masks concerning the dimensional stability and accuracy of the absorber pattern since submicron structures must be transferred.

In a very recent review (X-ray Lithography, IEEE Spectrum, February 1989), it is stipulated that several requirements still have to be met in order to produce technologically and economically viable X-ray lithography masks. It is also pointed out that the present masks cannot take the service stress. The literature is quite abundant with various patents and reviews concerning the manufacture of masks to be useful for X-ray lithography. The basic approach consists of an X-ray transparent membrane, stretched in a supporting frame, and an X-ray absorbing metal structure applied onto the membrane. Thus, silicon substrates are provided with a highly boron-doped layer, which acts as a stop layer for the membrane preparation. The wafer is then bonded to a glass plate and the silicon membrane is obtained by a selective etching technique. After deposition and patterning of the absorber, metallization is performed. One of the problems with metal films deposited on a substrate is a result of the considerable stresses in the metallized absorber layer which may cause distortion of the desired pattern.

Some improvements to remedy the above problems are described in some recent patents. Thus, according to Japanese Kokai 58/73118 (cf. C.A. 100, 148511), X-ray transmitting support films for X-ray lithography photomasks are prepared by coating substrates such as silicon wafer with an organic metal complex solution and subsequently calcining the coating at a temperature of about 600° C. It is claimed that the method gives support films with very few defects. After electron-beam lithography treatment of the metal layers, the silicon wafer was removed by photoetching to give a high quality X-ray photomask.

An amorphous hydrogenated boron-nitride or boron carbonnitride film made by plasma chemical vapor deposition is claimed to be useful for an X-ray transparent mask membrane (Japanese Kokai 63/76430 cf. C.A. 109, 139745). It is claimed that peeling of deposits on the electrodes and the susceptor was suppressed and thus contamination of the film with peeling dust could be prevented.

It has been reported (R. E. Acosta et al., Microelectronic Engineering 3, 1985 p. 573-9) that the distortion of X-ray masks is directly related to the stress of the absorber used. This distortion, resulting from the material absorbed, causes a decrease in the mask characteristic pattern and could render the masks unusable if the stress is not minimized. In the case of films deposited on single crystal silicon substrates, the distortion can be determined with the aid of an X-ray diffraction technique. In this case it is necessary to determine the crystalline integrity of the substrate before the deposition of the film to be studied, and to ensure that no damage to the crystal occurs during the process of deposition of the film. For non-crystalline substrates, the curvature of the substrate can be determined either by mechanical or by optical means.

In a very recent patent application (German 3,634,147, cf. C.A. 107, 208862), a lithographic mask structure is described. The mask consists of a ring-like support and a masking layer support containing a luminophor to improve the sensitivity of the resistive material.

In an Abstract by T. Funayama et. al. (J. Vac. Sci. Technol., Vol. 12, No. 6, Nov/Dec. 1975, 1324), a new X-ray lithography mask is described. The mask consists of an aluminum substrate and an $Al_2O_3$ film which was grown on said aluminum substrate by anodization. The transparent aluminum membranes of alumina film were made by chemically etching away parts of the aluminum substrate.

In a review by P. A. Sullivan (I.E.E.E. Transactions on Electron Devices, Vol. ED-23, No. 4, April 1976, 412-7) on Determination of Wavelength and Excitation Voltage for X-Ray Lithography, a similar X-ray mask based on aluminum is used, the aluminum oxide being grown on an aluminum substrate having a thickness of 75 microns. The disadvantage of the masks described above, is the fact that the frame which remains after the etching is actually a foil of aluminum metal which is very soft and ductile and therefore suffers from permanent distortions during its use. Moreover, during the distortion of the substrate and support the entire membrane will be fractured.

SUMMARY OF THE INVENTION

The present invention is for making of an oxide mask by depositing an oxide on a silicon wafer or copper substrate and removal of a portion of said silicon or copper. This leaves a metal oxide membrane supported by silicon or copper. It is an object of the present invention to provide a simple method for obtaining a mask for X-ray lithography. It is another object of the present invention to provide a simple method for obtaining a mask for X-ray lithography which does not suffer from any distortion and maintains its high accuracy.

DESCRIPTION OF THE PREFERRED EMBODIMENTS

One method for obtaining a mask for X-ray lithography consists of the steps of:

(a) deposition of a layer of an oxide on a silicon wafer, or another material, such as copper, to be used as a frame. The oxides can be titania, zirconia, alumina, tantalum oxide, silica, niobia, etc. The most preferred oxide is alumina which is light and which is transparent to X-rays. A thin (about 50 A) intermediate layer of a metal, like chromium and/or gold or other metal, may be deposited between the oxide and the substrate; the purpose of the intermediate layer is to improve adhesion and to stop the etching process of step (b);

(b) etching selectively a portion of the backside of the substrate, obtaining a membrane on the etched portion; and (c) obtaining a pattern delineation on said membrane.

The pattern delineation can be made by any known method, and most preferably by photoresist.

The X-ray lithography mask obtained is characterized by its increased strength, does not suffer from any distortion and therefore will preserve its accuracy even under stresses imposed by the steps of the mask production. The mask can be easily prepared and competes very favorably, with the known methods for production thereof.

The substrate may be of any material on which etching can be performed, such as silicon, titanium, zirconium, aluminum, niobium, etc. The most convenient substrate material is silicon.

The back side of the substrate is coated by a protective coating, such as photoresist or wax, which after selective removal uncovers a region on which a selective etching is performed on the surface of the substrate without affecting the aluminum oxide surface, thus obtaining the oxide membrane with the desired area. This etching is performed by immersion in known reagent solutions, e.g., hydrofluoric acid containing oxidizing reagents such as hydrogen peroxide, or hydrazine. The latter is particularly preferred since it does not attack the aluminum oxide. A person skilled in the art will select the proper solution for the selective dissolution of the substrate and the metal oxide residue according to convenience and the availability at site.

In the last step, a pattern delineation is carried out by a known method and preferably through photoresist by electroplating or by vapor deposition of masking material which should be a heavy metal selected from gold, tungsten, titanium, tantalum, etc. According to a preferred embodiment, a thin sublayer of gold may be provided. This sublayer makes the membrane surface conductive for electroplating, when gold will be deposited. In the case of masking by a heavy metal, the role of gold sublayer, which is only optional, is to protect the oxide membrane during the subsequent etching of the masking metal. The sublayer of gold can be eliminated by choosing an appropriate selective etching technique. The gold sublayer can be obtained by vapor deposition, and will be generally in the range of 10 to 1000 Angstroms.

One may also conceive to change the order of the last two steps, i.e., to obtain first a pattern delineation on said membrane and subsequently to carry out the selective etching.

In our previous CIP application, Ser. No. 442,868 filed on Nov. 29, 1989, the method for obtaining the X-ray lithographic mask comprised the deposition of a metal layer followed by a subsequent oxidation of said layer into the respective metal oxide by anodizing. Although the resulting mask does not suffer from any distortion, its disadvantage is related to the limit of the metal oxide layer to be produced, by said anodizing generally not exceeding above 8400 A, or to the porosity of the layer obtained. In case of vapor deposition of $Al_2O_3$ as in the present embodiment, any thickness can be obtained. Of course, the increased thickness improves the strength of the membrane.

According to a further embodiment, it is also possible to start with a wafer of silicon and after the deposition of the metal oxide layer, to obtain the window by etching only on the backside of the wafer and to leave a membrane of $SiO_2$ on the frame. In this case, no additional deposition of a metal oxide layer will be necessary.

The mask according to the present invention, being substantially free from any stresses, will not suffer from distortion. As known, the distortion of X-ray masks is directly related to the stress of the absorber used. In the mask according to the present invention, silicon wafers suggested by the prior art as membranes, are replaced by hard substances such as alumina or other oxide membranes and, accordingly, no distortion is encountered, while the frame is rigid enough and cannot undergo plastic deformation. Also, the resulting mask is transparent to light and thus it enables an optic alignment with the processed wafer.

The following is another method for obtaining the mask in accordance with the invention, which is described for illustration purposes only without implying any limitation.

The steps of the method are as follows:

In step 1, a wafer of silicon, which may be on the order of 0.4 mm thick and 2″ in diameter is taken as a frame.

In step 2, the silicon wafer is oxidized over its whole surface to form a silicon oxide layer thereupon.

In step 3 the silicon wafer is etched. This etching preferably takes the form of removing the silicon oxide on both sides to form circular windows on both sides.

In step 4 the wafer is coated with a layer of aluminum oxide on one side thereof. The aluminum oxide is in contact with the oxidized edge portions as well.

The aluminum oxide at this stage is still resting on the the silicon wafer base, and the silicon must be removed in order to provide the aluminum oxide membrane. The silicon is removed by etching with hydrazine which does not react with the aluminum oxide or silicon oxide.

While the invention will now be described in connection with certain preferred embodiments in the following Examples, it will be understood that it is not intended to limit the invention to these particular embodiments. On the contrary, it is intended to cover all alternatives, modifications and equivalents as may be included within the scope of the invention as defined by the appended claims.

EXAMPLE 1

A silicon wafer, 2 inches in diameter, 0.4 mm thick, is coated by 50 A of chromium and 50 A of gold and 5000 A of aluminum oxide. The backside of the wafer is coated by a photoresist and then exposed to light through a mask with a round opening, 2 cm in diameter and photographically developed, to expose the round opening. The wafer is then etched in a solution of HF, $H_2O_2$ and nitric acid at about 30° C. and rinsed in deionized water. This process produces a round compact aluminum oxide membrane, 0.5 micrometer thick, 2 cm diameter.

Pattern delineation on this membrane is attained by a conventional lithographic method of gold deposition through a photoresist. In this manner a layer of 0.5 micrometer of gold is electrodeposited on top of a 100 angstrom layer of gold produced by vapor deposition.

EXAMPLE 2

In another experiment the compact aluminum oxide membrane was prepared as in Example 1, but the final pattern delineation was performed by vapor deposition of 0.5 micrometer of tungsten on top of a 100 angstrom layer of gold. Subsequently, a final selective dissolution was carried out by a 1:1 mixture of nitric and hydrofluoric acids through a patterned photoresist coating.

The purpose of the gold is to protect the membrane during the subsequent etching of the tungsten.

EXAMPLE 3

A silicon wafer, 2 inches in diameter, 0.5 mm thick, was first coated by a layer of 0.5 microns of titanium oxide and further coated on one side by photoresist. The back side of the disc was then exposed to light through a mask with a round opening, 2 cm in diameter and photographically processed to expose the opening area. The disc was then anodically etched in a methanol solution saturated with ammonium chloride at 10 volts for 20 minutes. This process produced a continuous titanium oxide membrane, of about 0.5 micrometer thick resting on a silicon support, Pattern delineation on this membrane was carried out as in Example 1.

EXAMPLE 4

A silicon wafer 2" in diameter and 0.6 mm thick is oxidized over its entire surface to form a silicon oxide layer thereupon. Round windows are etched into the top and bottom surfaces of said silicon oxide covered wafer in order to expose silicon in the etched regions. A layer of 5000 A of aluminum oxide is deposited on one side of the silicon wafer so that the aluminum oxide covers the region which is covered by pure silicon as well as the perimeter region which is covered with a layer of silicon oxide.

The thin aluminum oxide membrane is now completed by etching away the unoxidized silicon from the second side of the wafer by a solution of hydrazine, thereby exposing the second side of said aluminum oxide.

The aluminum oxide membrane thus created is surrounded by a support consisting of a silicon ring which is covered with silicon oxide.

Pattern delineation on this membrane was carried out as described in Example 1.

EXAMPLE 5

A silicon wafer, 2 inches in diameter, 0.4 mm thick, is coated by 50 A of gold and 5000 A of aluminum oxide. The backside of the wafer is coated by a photoresist and exposed to light through a mask with a round opening, 2 cm in diameter and photographically developed, to expose the round opening. The wafer is further etched in a solution of HF, $H_2O_2$ and nitric acid at about 30° C. and rinsed in deionized water. In this manner there is obtained a round compact aluminum oxide membrane having a thickness of 0.5 micrometer and 2 cm diameter.

The pattern delineation of the membrane was carried out as in Example 1.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Thus, for instance, one may conceive to make first the pattern delineation of a disc and subsequently etching the substrate.

I claim:

1. A method for obtaining a mask for X-ray lithography which consists of the steps of:
    (a) deposition of a metal oxide layer of titania, zirconia, niobia or tantalum oxide on a substrate;
    (b) etching selectively a portion of the backside of the substrate, thus obtaining a metal oxide membrane supported on the substrate; and
    (c) obtaining a pattern delineation on said membrane.
2. The method in accordance with claim 1, wherein said oxide is titania.
3. The method in accordance with claim 1, wherein said oxide is zirconia.
4. The method in accordance with claim 1, wherein said substrate is silicon.
5. The method in accordance with claim 1, wherein said substrate is copper.
6. The method in accordance with claim 5, wherein said etching of a portion of said copper is accomplished with ammonia containing copper ions.
7. The method in accordance with claim 1, wherein said etching is carried out by immersion in a solution selected from hydrofluoric acid containing oxidizing reagents and hydrazine.
8. The method in accordance with claim 1, wherein said pattern delineation is carried out by photoresist.
9. The method in accordance with claim 8, wherein said photoresist is carried out by vapor deposition of masking material.
10. The method in accordance with claim 9, wherein said masking material is a heavy metal selected from gold, tungsten, titanium, and tantalum.
11. The method in accordance with claim 8, wherein said photoresist is carried out by electroplating.
12. A method for obtaining a mask for X-ray lithography which consists of the steps of:
    (a) depositing a metal oxide layer on a copper substrate;
    (b) etching selectively a portion of the backside of the copper substrate, thus obtaining a metal oxide membrane supported on the copper substrate; and
    (c) obtaining a pattern delineation on said membrane.
13. The method in accordance with claim 12, wherein said oxide is alumina.
14. The method in accordance with claim 12, wherein said oxide is silica.
15. The method in accordance with claim 12, wherein said etching of a portion of said copper is accomplished with ammonia containing copper ions.
16. The method in accordance with claim 12, wherein said pattern delineation is carried out by photoresist.

17. The method in accordance with claim 16, wherein said photoresist is carried out by vapor deposition of masking material.

18. The method in accordance with claim 17, wherein said masking material is a heavy metal selected from gold, tungsten, titanium, and tantalum.

19. The method in accordance with claim 16, wherein said photoresist is carried out by electroplating.

20. The method in accordance with claim 1, wherein said oxide is titania or zirconia.

* * * * *